United States Patent
Saxe

(10) Patent No.: US 8,385,133 B2
(45) Date of Patent: Feb. 26, 2013

(54) HIGH-SPEED DOWNLOAD DEVICE USING MULTIPLE MEMORY CHIPS

(75) Inventor: Charles L. Saxe, Portland, OR (US)

(73) Assignee: Avnera Corporation, Beaverton, OR (US)

(*) Notice: Subject to any disclaimer, the term of this patent is extended or adjusted under 35 U.S.C. 154(b) by 0 days.

(21) Appl. No.: 11/633,901

(22) Filed: Dec. 5, 2006

(65) Prior Publication Data

US 2008/0133822 A1    Jun. 5, 2008

(51) Int. Cl.
*G11C 7/10* (2006.01)
(52) U.S. Cl. ......... 365/189.05; 365/233.17; 365/238.5
(58) Field of Classification Search .......... 365/189.05, 365/189.04, 189.17, 233.1, 233.13, 233.19, 365/233.17, 238.5; 711/103, 148, 112, 114
See application file for complete search history.

(56) References Cited

U.S. PATENT DOCUMENTS

| | | | | |
|---|---|---|---|---|
| 5,805,632 A * | 9/1998 | Leger | ............... | 375/282 |
| 7,016,235 B2 * | 3/2006 | Faue et al. | ............... | 365/189.02 |
| 7,096,378 B2 * | 8/2006 | Stence et al. | ............... | 714/6 |
| 7,120,761 B2 * | 10/2006 | Matsuzaki et al. | ............... | 711/149 |
| 2008/0209114 A1 * | 4/2008 | Chow et al. | ............... | 711/103 |

* cited by examiner

*Primary Examiner* — Anh Phung
*Assistant Examiner* — Hien N Nguyen
(74) *Attorney, Agent, or Firm* — Joseph P. Curtin, L.L.C.

(57) ABSTRACT

A flash memory system for an A/V player, utilizing a two-level round-robin write scheme upon N flash memory planes, enabling the A/V player to be loaded with data at a data throughput essentially N times the write throughput of one of the flash memory planes. The flash chips' memory cores and data registers, and the memory system's write buffers, can be kept fully utilized during data writing.

22 Claims, 5 Drawing Sheets

HIGH-SPEED DOWNLOAD DEVICE USING MULTIPLE MEMORY CHIPS

BACKGROUND OF THE INVENTION

1. Technical Field of the Invention

This invention relates generally to electronic memory devices, and more specifically to a data download repository device using a plurality of slow-write-speed memory devices and a corresponding number of fast-write-speed buffer devices to achieve a fast write speed for capturing a data stream.

2. Background Art

Digital memory is a key component in a wide variety of electronic devices. In the usage of some memory-based electronic devices, such as personal computers, the writing and reading of data are typically done in a random pattern and arbitrary timing of writes and reads. In some such devices, the write speed (throughput and/or latency) may be more important than the read speed, while in others, the read speed may be more important than the write speed.

In the usage of other memory-based electronic devices, such as MP3 players, the writing and reading of data are typically done at different and distinct times. Often, the writing involves dumping a very large quantity of data, perhaps many gigabytes, into the device's memory at once, and the reading is done later, and often in significantly smaller chunks. In some such applications, the write speed becomes a commercially very important characteristic of the apparatus. For example, consumers may prefer one model very strongly over another model, simply because the former requires them to spend significantly less time waiting for the data writing to occur.

What is needed is an improved apparatus and method for writing large amounts of data quickly to a memory-based electronic device.

DETAILED DESCRIPTION

The invention will be understood more fully from the detailed description given below and from the accompanying drawings of embodiments of the invention which, however, should not be taken to limit the invention to the specific embodiments described, but are for explanation and understanding only.

Figure 1:
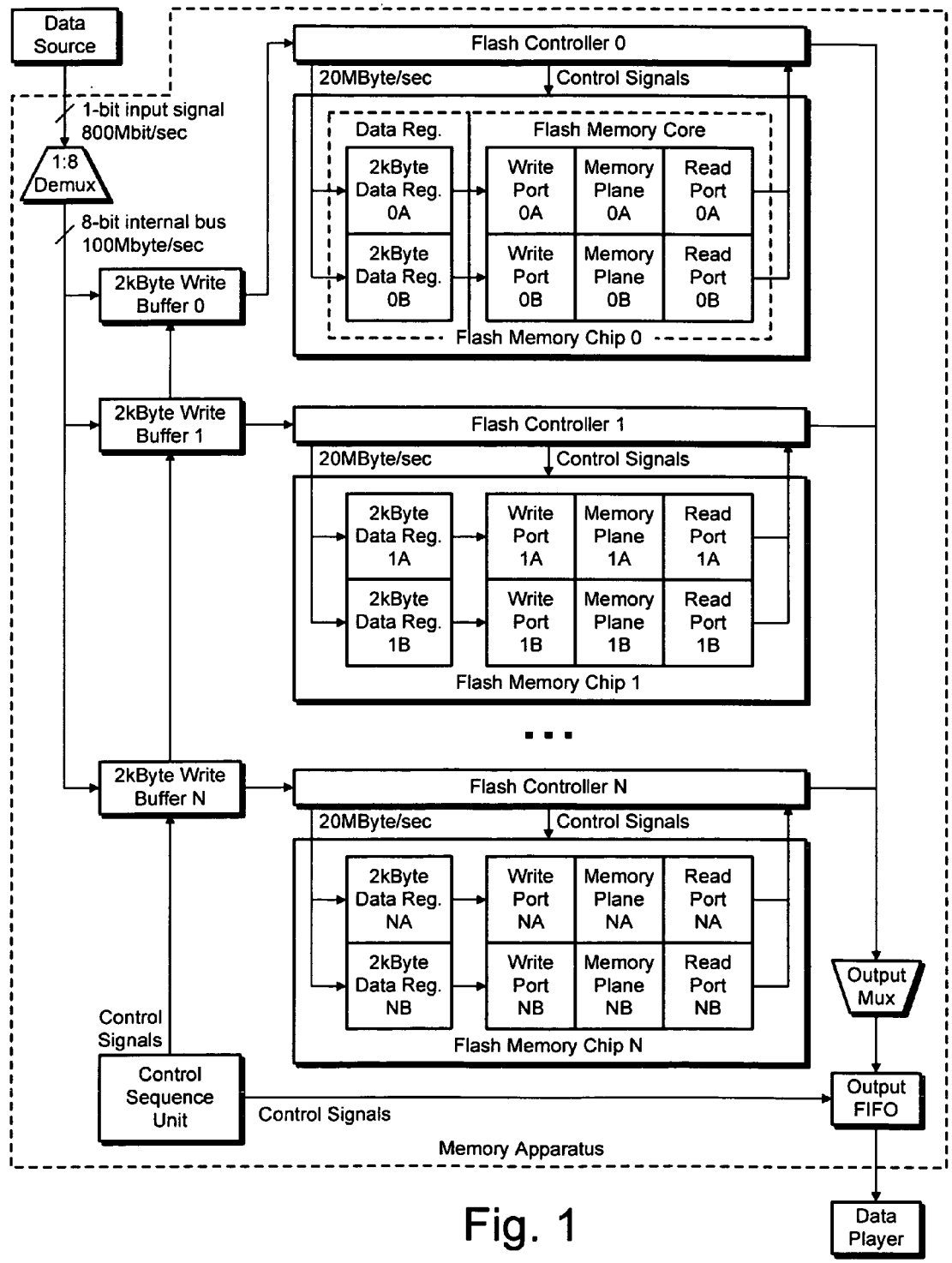
FIG. 1 shows one embodiment of the memory apparatus of this invention.

FIG. 1 illustrates a memory apparatus according to one embodiment of this invention. The memory apparatus is adapted for coupling to a data source which writes data to the memory apparatus (either in a data "push" from the data source, or a data "pull" by the memory apparatus), and for coupling to a data player which reads data from the memory apparatus (either in a data push by the memory apparatus, or a data pull by the data player). The data player and the memory apparatus may, in some applications, be included in the same memory-based apparatus (MBA), such as a portable music player, video player, cellular telephone, personal digital assistant, or the like. In other applications, such as a thumb drive or personal data archive, the memory apparatus may be a stand-alone device, and the data player may be e.g. a personal computer. In some applications, the data source and the data player may be the same device.

The memory apparatus may, in some embodiments, be adapted to interface with a serial data source which writes a data stream to the memory apparatus via a 1-bit input signal. For example, the data source may provide a 1-bit input signal at 800 Mbits/second. The input signal data stream may utilize any suitable communication channel (wired or wireless), and the data may be transmitted according to any suitable protocol, encoding, and so forth.

The memory apparatus has a multi-bit internal bus. If the internal bus is wider than the input signal, the memory apparatus includes an appropriate demultiplexer which converts the input signal into the correct data width for the internal bus. In the example shown, the data source provides a 1-bit signal and the memory apparatus has an 8-bit internal bus, so the demultiplexer is a 1:8 demux.

The memory apparatus includes a plurality of distinct memory devices which are independently writeable. In some embodiments, the memory devices are distinct, monolithic integrated circuits (ICs), while in others, they are distinct clusters of ICs, and in still others, they are distinct circuits of other configurations. The memory devices may be of any memory type suitable for the application at hand, such as flash, DRAM, SRAM, EEPROM, or what have you. For convenience of illustration, they are shown in the drawings as being flash memory chips. The invention may find particular usefulness when used with NAND flash memory chips.

In embodiments using flash memory, each memory chip include a flash memory core, and a data register which serves as an input buffer and is capable of being written in (byte) serial manner, whereas the flash memory core itself is typically writeable only in page granularity. Thus, the data register, which is typically built using SRAM circuitry, is written until a page's worth of data has been received, then that page is written to the flash core. In many common flash memory chips, the flash memory core is divided into two planes (A and B), each having its own, dedicated write port, read port, and data register. In the embodiment shown, the flash memory chip uses a 2 kByte page size, and the data registers contain 2 kBytes of SRAM, or slightly more if needed for administrative purposes. The storage capacity of the memory planes is not especially significant, and can any be desired or available size, such as many hundred MBytes or many GBytes.

In embodiments using flash memory, each memory chip is typically accompanied by its own, dedicated flash controller device, which may be a separate IC, or may be incorporated into its respective flash IC, or, alternatively, all of the flash controllers can be placed on a single controller IC. The flash controller governs the writing and reading functions of its flash memory chip. In one embodiment, the flash memory chip is capable of receiving a sustained write of 20 MBytes/second, and the flash controller sends appropriate control signals to divide this stream (in bit slice fashion or in time slice fashion), such that each flash plane is written at 10 MBytes/second.

The number (N) of memory devices is determined, in large measure, by the desired write speed of the memory apparatus as compared to the input signal data rate from the data source. In the example shown, the data source writes data at 800 Mbits/second, or 100 MBytes/second, and each flash memory chip can be fed 20 MBytes/second, so the memory apparatus includes 100/20=5 memory devices. This is one specific example of the basic formula U/V=N, where U is the maximum data output rate of the data source, V is the maximum data input rate of each memory device (including all planes of that device), and N is the number of memory devices thus required in order for the memory apparatus to be able to keep up with the data source and capture all of its output. More specifically, N is the next integer value that is greater than or equal to U/V.

In some embodiments, the memory apparatus employs a two-level pipeline system, with the second level comprising the data registers of the flash memory chips themselves. The first level comprises a set of write buffers each disposed at the data input of a respective flash controller, as shown. The write buffers are, optionally but advantageously, the same size as the flash memory chips' data registers—in the example shown, 2 kBytes each.

The write buffers operate under control of a control sequence unit, which causes them to receive the incoming data stream in round-robin fashion.

Figure 2:
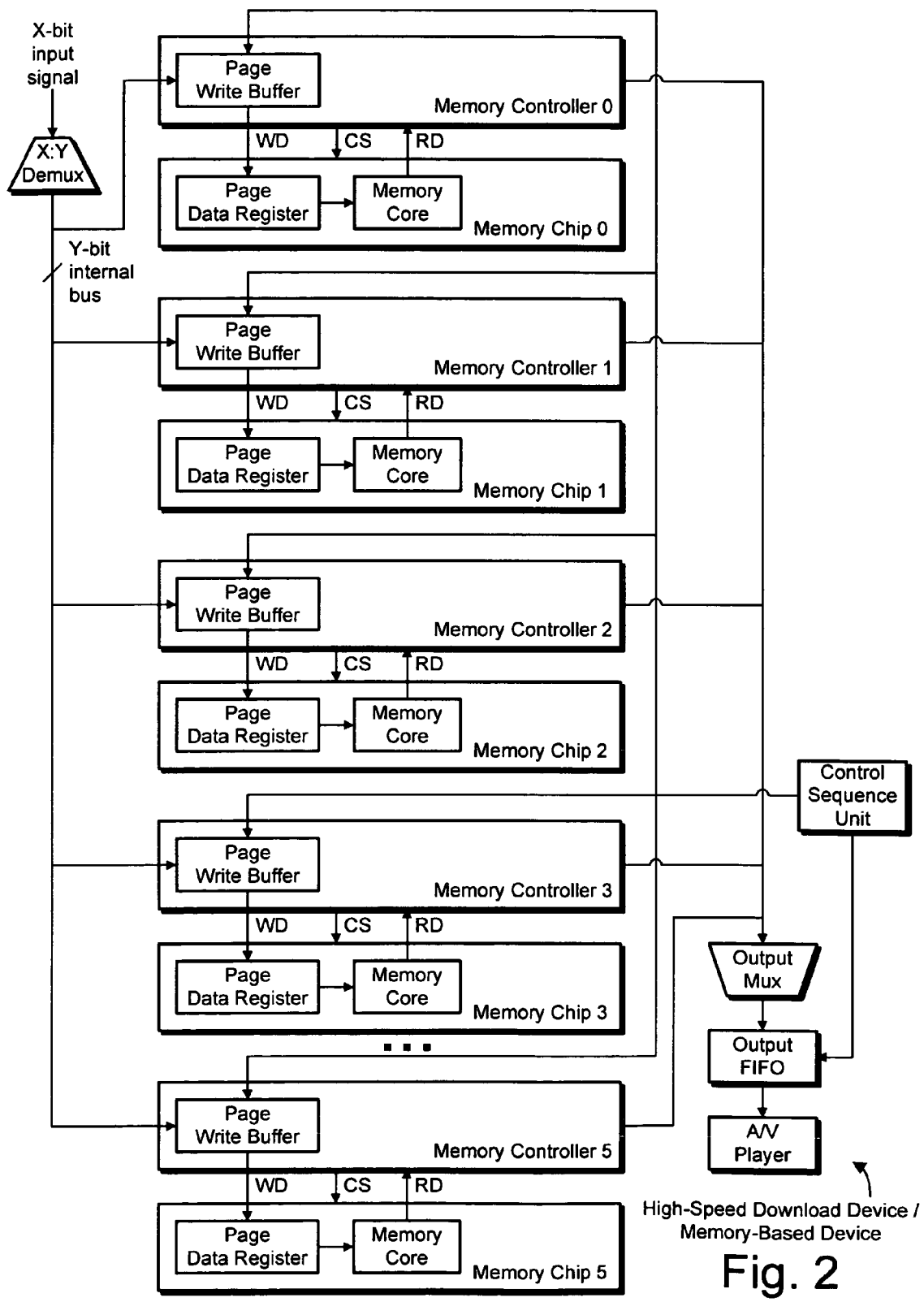
FIG. 2 shows one embodiment of a high-speed download device using the memory apparatus of FIG. 1.

FIG. 2 illustrates a high-speed download device or memory-based apparatus utilizing one embodiment of the memory device of this invention. The apparatus includes N memory devices such as memory chips having memory cores implemented in flash or other suitable technology, and N memory controllers for controlling the N respective memory devices. The apparatus is adapted to receive an X-bit input signal, and includes a Y-bit internal bus. If X<>Y, the apparatus includes an X:Y demux.

The apparatus optionally utilizes a two-level data write pipeline system. The first level includes N page write buffers, each associated with a respective one of the N memory devices. In the embodiment shown, the page write buffers are embedded within the respective memory controllers; in other embodiments, they could be separate components located outside the memory controllers, or a single, shared buffer device. The second level of the pipeline includes N page data registers, each associated with one of the N memory devices. In the embodiment shown, the page data registers are embedded within the memory devices; in other embodiments, they could be separate components located outside the memory devices, or within the memory controllers.

The memory controllers control operation of their respective memory devices via a set of control signals (CS). The page write buffers are coupled to receive input data from the internal bus. The page write buffers write data (WD) to their corresponding page data registers. The page data registers transfer this data to their corresponding memory cores one page at a time. The memory controllers read data (RD) from their corresponding memory cores.

The page write buffers operate under control of a control sequence unit. An output mux gathers read data from the memory controllers and sends it to an output FIFO which smoothes the flow of data such that it can appear at a constant output rate suitable for consumption by e.g. an audio-visual (A/V) data player of the apparatus. The output FIFO is also under control of the control sequence unit.

The apparatus operates as a high-speed data download device, adapted to e.g. be rapidly loaded with a large quantity of A/V data such as a digital movie in MPEG, WMV, AVI, or other format, or such as a large collection of digital music in MP3, WMA, OGG, or other formats. The A/V player may include a video display screen and/or loudspeakers (not shown), or outputs for such, and any circuitry and logic required for supporting them.

Figure 3:
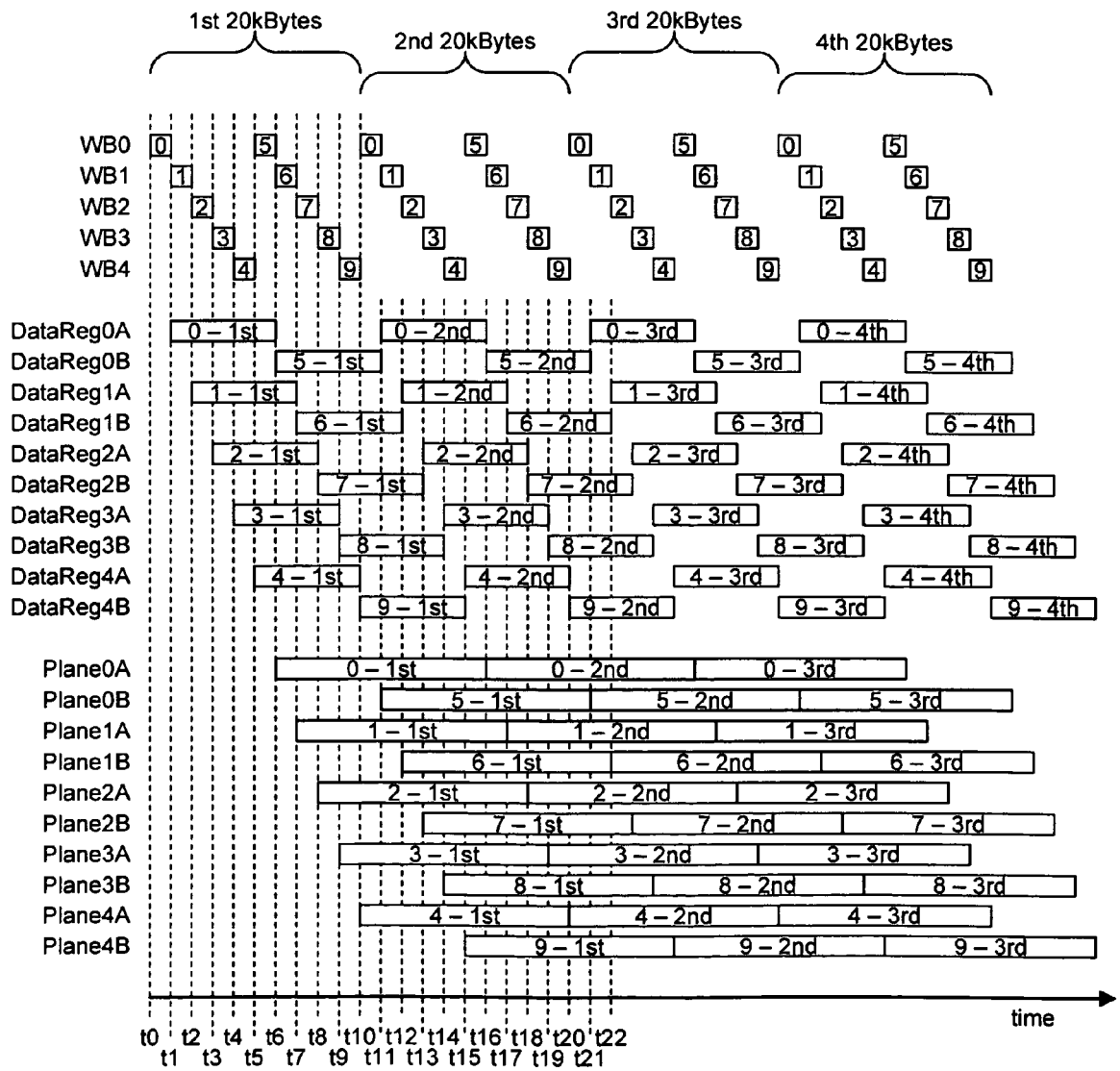
FIG. 3 shows a timing diagram according to one method of operation of the memory apparatus of FIG. 1 or the high-speed download device of FIG. 2.

FIG. 3 illustrates one embodiment of a method of operation of the memory apparatus (or the high-speed download device which includes the memory apparatus), and may be studied in conjunction with FIGS. 1 and 2. The operation will be described with reference to an embodiment in which there are five 2 kByte write buffers, and there are five two-plane memory devices with each plane having a 2 kByte data register, for a total of 20 kBytes of data register. The incoming data stream is discussed in terms of 2 kByte pages, arriving in first, second, etc. 20 kByte serial chunks. Each 20 kByte chunk includes ten pages 0 through 9, with e.g. the third page of the second chunk being identified as "2-2nd". Due to the physical size limitations of the graphical representation of the data pages in the write buffers (WB0 through WB4), the simplified nomenclature "0" through "9" is used in the small blocks representing the transfer of those pages, with the additional notations "1st 20 kBytes" etc. above the timing diagram for completeness and clarity to distinguish page 2 of the 2nd 20 kBytes from page 2 of the 1st 20 kBytes. In the larger blocks which represent the pages written to the data registers (DataReg0A through DataReg4B) and the pages written to the flash memory planes (Plane0A through Plane4B), the nomenclature "P-Qth" is used to represent 2 kByte page P of the Qth 20 kBytes.

The 100 MByte/second data stream begins arriving at time t0. The control sequence unit causes Write Buffer 0 (WB0) to store the first 2 kByte page (0-1st), until WB0 is full at time t1, when the control sequence unit causes WB1 to store the next 2 kByte page (1-1st), and so forth. At time t5, WB4 has become full, and the control sequence unit causes WB0 to store the next 2 kByte page (5-1st), thus beginning the round-robin operation of the write buffers.

At time t1, when WB0 is full of page 0-1st, the control sequence unit causes WB0 to begin writing its data contents to flash controller 0, which writes the data through to data register 0A. The flash chip's data register has an input throughput only ⅕ that of the write buffer, so the write is not complete until time t6. At time t2, WB1 is full, and the control sequence unit causes WB1 to begin writing to flash controller 1, which writes to data register 1A, which completes at time t7. Operation continues in this manner.

At time t6, WB0 has just finished writing page 0-1st through flash controller 0 to data register 0A, and the control sequence unit causes WB0 to begin writing data 5-1st through flash controller 0 to register 0B.

Between time t5 and t6, WB0 is being simultaneously written (new data 5-1st arriving from the data source) and read (the previously received data 0-1st being written out to data register 0A). In the tightest possible configuration, the last byte of data 0-1st is written out just as that storage is needed for writing the last byte of data 5-1st. In other methods of operation, less critical timings are employed, such as by using one extra memory chip (see FIG. 4), such that the total bandwidth of the memory chips is greater than, not merely equal to, the input bandwidth from the data source.

At time t6, the first page 0-1st has been written to data register 0A, and flash controller 0 causes data register 0A to write (or "program") the page through write port 0A into memory plane 0A at a location determined by the flash controller. The flash controller will typically write to the memory chip in such an order as to fill it from top to bottom (or vice versa). The sequence will be initiated by the control sequence unit. Because the memory plane has a write speed only ½ that of the data register, and only ⅒ that of the write buffer, the page write is not complete until time t16.

From time t7 to time t17, flash memory chip 1 writes page 1-1st to plane 1A. From time t8 to time t18, flash memory chip 2 writes page 2-1st to plane 2A, and so forth. From time t11 to time t21, flash memory chip 0 writes page 5-1st to plane 0B; this overlaps the time when flash memory chip 0 is writing page 0-1st to plane 0A.

At time t16, flash memory chip 0 has finished writing page 0-1st to plane 0A, and begins writing page 0-2nd to a different address in plane 0A, and the round-robin repeats itself until the data stream ends or the memory apparatus is full, whichever comes first.

The memory apparatus has enough memory devices that their combined write throughput is at least as fast as the incoming data stream. And it has enough write buffers that their combined write throughput is at least as fast as the incoming data stream. In the method shown, U/V=N, where U is 100 MBytes/second, V is 20 MBytes/second, and N is 5.

Figure 4:
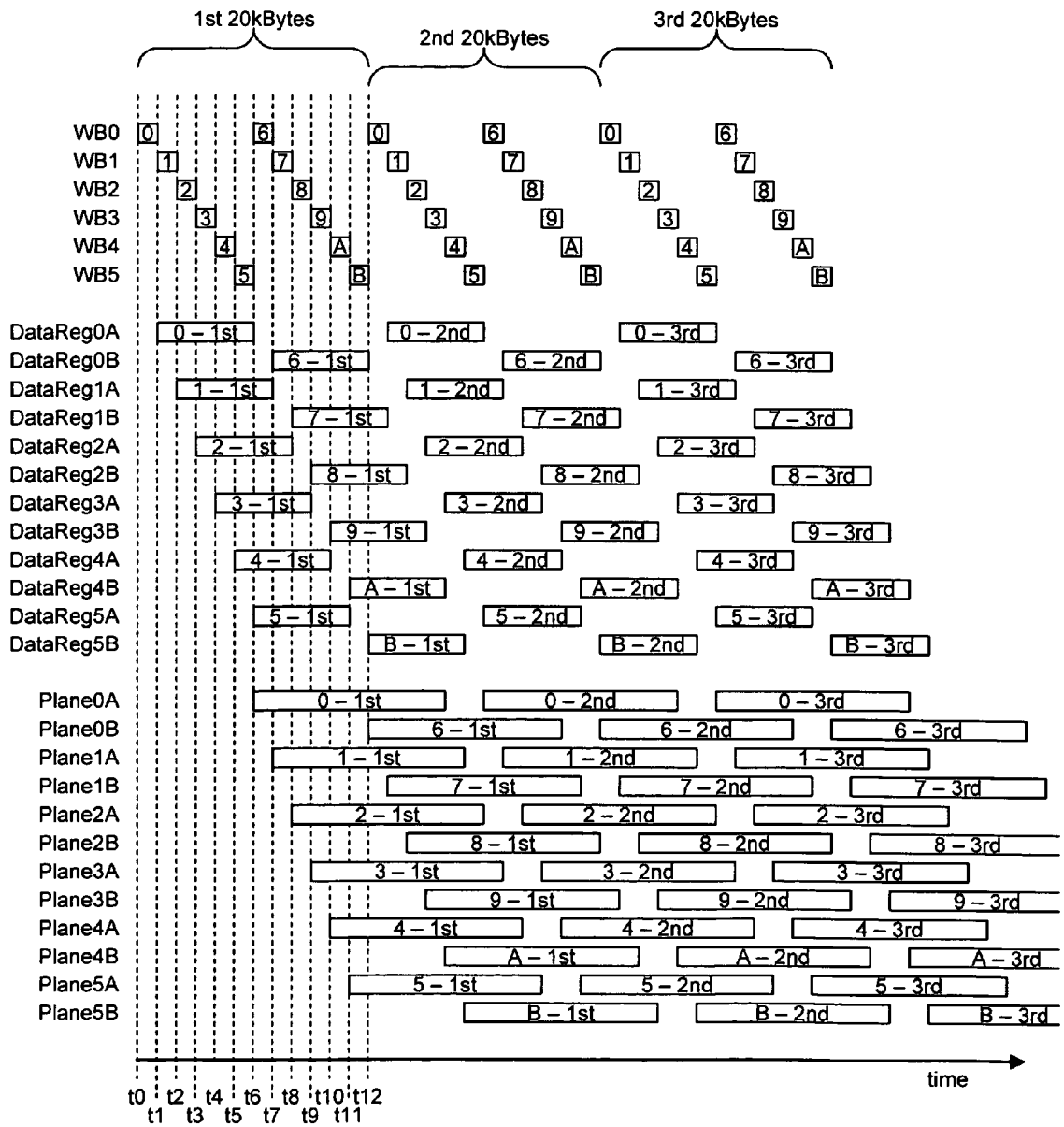
FIGS. 4-5 show timing diagrams according to other methods of operation of the memory apparatus of FIG. 1 or the high-speed download device of FIG. 2.

FIG. 4 illustrates another embodiment of a method of operation of the memory apparatus (or the high-speed download device which includes the memory apparatus), and may be studied in conjunction with FIGS. 1 and 2. The memory apparatus includes six write buffers (WB0 to WB5) and six memory devices including twelve data registers (DataReg0A to DataReg5B) and six dual-plane flash memory chips (Plane0A and Plane0B to Plane5A and Plane5B).

From time t0 to t1, page 0-1st is written to WB0, then from time t1 to t2, page 1-1st is written to WB1, and so forth, until from time t11 to time t12 page B-1st ("B" being hexadecimal notation for decimal value "11") is written to WB5. At time T12, round robin filling of the write buffers begins, with page 0-2nd being written to WB0.

At time t1, WB0 begins writing its page of data to DataReg0A, which completes at time t6. At time t2, WB1 begins writing to DataReg1A, and so forth, until at time t6, WB5 begins writing to DataReg5A. The fundamental difference between the methods of FIG. 3 and FIG. 4, is that in FIG. 3, U/V=N, whereas in FIG. 4, U/V=N+1. In other words, in the high-speed download device that uses the method of FIG. 4, there is one "extra" memory chip and one extra write buffer. This provides extra write bandwidth into the write buffers, data registers, and memory planes, and may enable the device to use slightly less capable memory chips. Specifically, in order to use the method of FIG. 3, the write buffers must be able to do simultaneous reads and writes; as indicated above, between times t5 and t6, WB0 is both receiving page 5-1st and writing page 0-1st to DataReg0A. But in the method of FIG. 4, there is no such overlap; WB0 writes page 0 to DataReg0 from time t1 to time t6, and then begins receiving page 6 at time t6. Extra write buffer WB5 receives page 5-1st from time t5 to time t6.

As each page is completely written to a data register, the data register can begin writing ("programming") that page to its data plane. For example, at time t6, page 0-1st has finished being written from WB0 to DataReg0A, and DataReg0A begins writing it to Plane0A. Between times t6 and t7, neither DataReg0A nor DataReg0B is being read or written. At time t11, page 5-1st has been completely written to DataReg5B, which begins writing it to Plane5A. At time t12, page 6-1st has been completely written to DataReg0B, which begins writing it to Plane0B.

If further relaxations are necessary, such as if there is some recovery time required between filling a write buffer and beginning to write its contents to a data register, or between filling a data register and beginning to write its contents to a memory plane, additional memory chips can simply be added to the high-speed download device.

Both the method of FIG. 3 and the method of FIG. 4 begin writing to next sequential data registers, and to next sequential planes, at every time interval (whose duration is defined as the amount of time required to receive one write buffer's worth of data from the data source). But having the extra memory chip's data registers and memory planes provides one additional time period between writing sessions for each given data register (e.g. 6 periods in FIG. 4 versus 5 periods in FIG. 3), and two additional time periods between writing sessions for each given memory plane (e.g. 2 periods in FIG. 4 versus 0 periods in FIG. 3).

Figure 5:
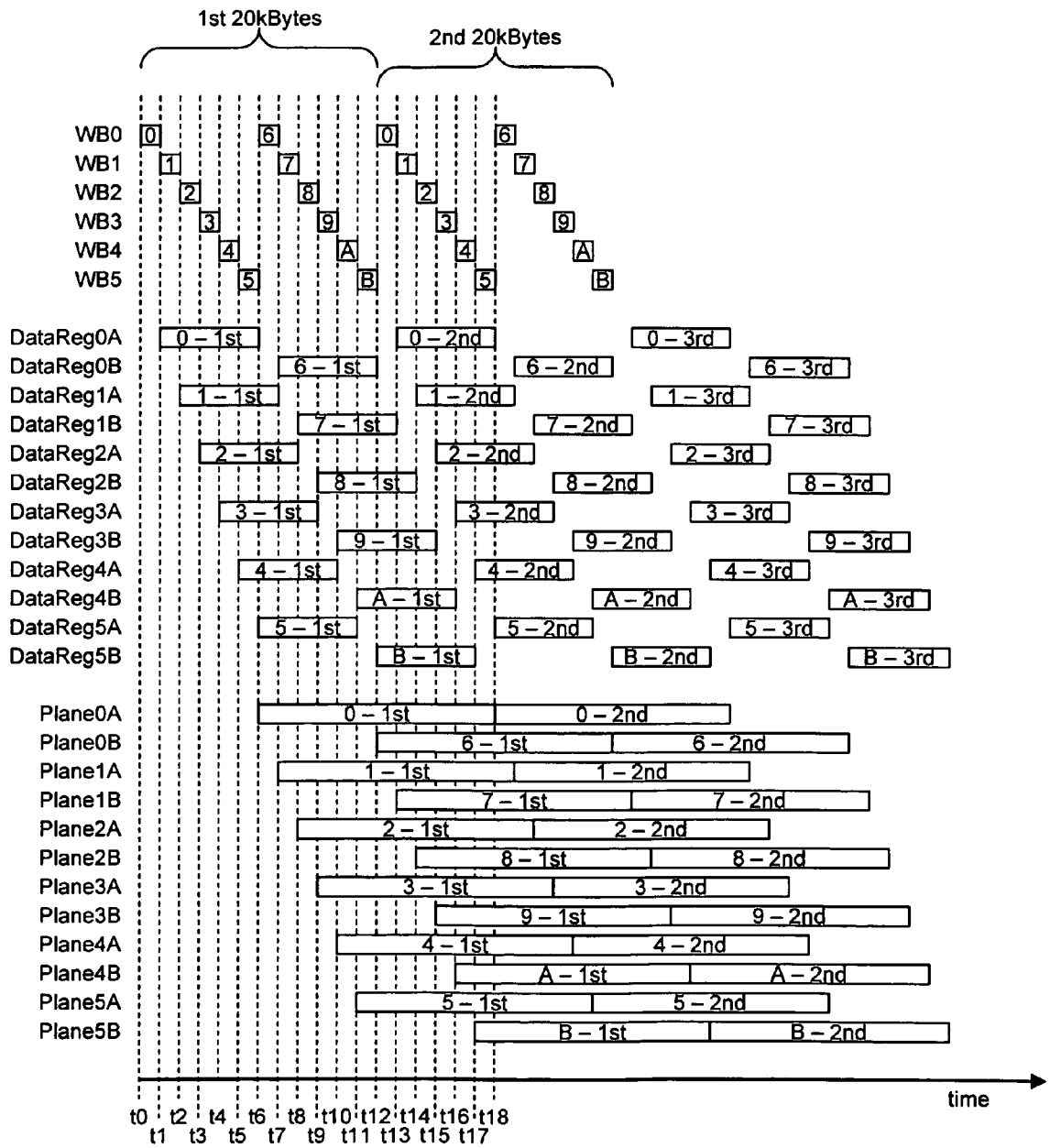

FIG. 5 illustrates another method of operation, in which there is an "extra" memory buffer and memory chip in terms of the ability of the write buffers and data registers to receive data, but in which the memory planes are relatively slower as compared to the data registers, than those of FIG. 3 or 4. Specifically, each memory plane requires 12 time periods in order to complete receiving data from its data register, versus only 10 time periods in FIGS. 3 and 4. Even though the write buffers and data registers, which require only 1 period and 5 periods to completely fill, would be able to keep up with the incoming data stream if there were only 5 write buffers and 10 data registers, 10 memory planes would not-12 memory planes are required to keep up, if each takes 12 time periods to fill. So, it is necessary in this case to have 12 memory planes, 12 data registers, and 6 write buffers.

CONCLUSION

The multiple memory devices and the round-robin write technique of the high-speed download device of this invention provide data storage throughput at a significantly higher data rate than could be obtained if there were only one memory device.

When one component is shown or said to be adjacent another component, it should not be interpreted to mean that there is absolutely nothing between the two components, only that they are in the order indicated and/or that there exists a direct or indirect connection between them.

The various features illustrated in the figures may be combined in many ways, and should not be interpreted as though limited to the specific embodiments in which they were explained and shown.

Those skilled in the art, having the benefit of this disclosure, will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. A memory apparatus for storing data written by a data source at a first data rate DR1, the memory apparatus comprising:
   an internal data bus for receiving the data from the data source;
   N write buffers each coupled to receive data from the internal data bus at a second data rate DR2;
   N memory controllers;
   N memory devices each coupled to receive data from a respective one of the write buffers, and each coupled to be controlled by a respective one of the memory controllers, and each including,
      (i) M data registers each coupled to receive and store data at a third data rate DR3 from the respective one of the write buffers, and
      (ii) M memory cores each coupled to receive and store data at a fourth data rate DR4 from a respective one of the data registers;
   a control sequence unit coupled to control the write buffers; and
   output means for reading data from the memory cores;
   wherein,
   $M>=1$,
   $N>1$,
   $DR2*N>=DR1$,
   $DR3*M>=DR2$, and
   $DR4*M>=DR2$.

2. The memory apparatus of claim 1 wherein:
   each memory device comprises a flash memory device having a flash page size; and
   each data register is adapted to store the flash page size of data.

3. The memory apparatus of claim 2 wherein:
   each write buffer is adapted to store the flash page size of data.

4. The memory apparatus of claim 3 wherein:
M>=2;
such that each flash memory chip includes,
>=2 memory planes, and
>=2 data registers, each coupled to provide data to a respective one of the memory planes.

5. The memory apparatus of claim 4 wherein:
N>=5.

6. The memory apparatus of claim 2 further comprising:
an A/V player coupled to receive data from the output means.

7. The memory apparatus of claim 6 wherein:
the N memory controllers comprise>=5 flash controllers each able to write at least 20 Mbytes/second;
the N memory devices comprise>=5 flash memory chips in which,
the M data registers include>=2 data registers,
the M memory cores include>=2 flash memory planes;
wherein the memory apparatus is able to maintain a sustained write capability of at least 100 Mbytes/second when the memory apparatus includes unused memory space.

8. A memory apparatus for storing data from a serial data source for later consumption by a data player, the memory apparatus comprising:
a 1:N demux having an input for receiving the data from the serial data source;
N write buffers coupled to receive data from the demux;
M page-size data registers coupled to receive data from the write buffers;
M flash memory planes coupled to receive data from respective ones of the data registers;
at least one flash memory controller coupled to control writing of the data from the data registers to the flash memory planes and to control reading of data from the flash memory planes;
a control sequence unit coupled to control reading of the data from the demux by the write buffers and to control writing of the data from the write buffers to the data registers; and
an output coupled to receive data read from the flash memory planes and to provide that data to the data player.

9. The memory apparatus of claim 8 further comprising:
the data player.

10. The memory apparatus of claim 8 wherein:
N>=5; and
M>=N*2.

11. The memory apparatus of claim 10 wherein:
N=5;
M=10; and
wherein the 10 flash memory planes comprise 5 flash memory chips.

12. The memory apparatus of claim 8 wherein the output comprises:
an output mux coupled to outputs of the memory controller(s); and
an output FIFO coupled to an output of the output mux.

13. A method of storing data in a memory apparatus, the method comprising:
receiving an X-bit/sec data stream from a data source;
storing the data stream in N write buffers in round-robin fashion, one page of data per write buffer;
when a given write buffer has stored in it a page of data, writing the page of data stored in the write buffer to one of M respective data register(s) associated with that write buffer;
when a given data register has stored in it a page of data, writing the page of data stored in the data register to a respective memory plane associated with that data register;
wherein $T_{mp}<=M*T_{dr}$;
wherein $T_{mp}$ is an amount of time required for writing the page of data from the data register to the memory plane, and $T_{dr}$ is an amount of time required for writing the page of data from the write buffer to the data register.

14. The method of claim 13 wherein:
$T_{dr}<=N*T_{wb}$;
wherein $T_{wb}$ is an amount of time required for writing storing the page of data in the write buffer.

15. The method of claim 14 wherein:
$T_{dr}=N*T_{wb}$.

16. The method of claim 13 wherein:
$T_{dr}<=(N-1)*T_{wb}$;
wherein $T_{wb}$ is an amount of time required for writing storing the page of data in the write buffer;
wherein the write buffer is adapted to perform simultaneous write and read operations.

17. The method of claim 13 wherein:
$T_{dr}=(N-1)*T_{wb}$.

18. The method of claim 13 wherein:
wherein $T_{mp}=M*T_{dr}$.

19. The method of claim 18 wherein:
M=2.

20. A method of storing a serial data stream of at least Y bits/second in a memory apparatus, the method comprising:
demuxing the serial data stream to a parallel data stream of at least X Bytes/second;
in round-robin manner, writing data from the parallel data stream to at least five write buffers;
when a given write buffer contains a page worth of data, writing the page worth of data to a data register of a flash memory device associated with the given write buffer;
when a given data register contains a page worth of data, writing the page worth of data to a flash memory plane of the data register's flash memory device;
wherein the memory apparatus includes at least 10 of the data registers and at least 10 of the flash memory planes;
whereby the memory apparatus is enabled to use flash memory planes each having a write speed not significantly greater than X/10 Bytes/second.

21. The method of claim 20 further comprising:
continuing the round-robin writing to the write buffers, the writing to the write buffers, the writing to the data registers, and the writing to the flash memory planes until a first to occur of the serial data stream ending and the memory apparatus becoming full.

22. The method of claim 20 further comprising:
at a later time, reading data from the flash memory planes; and
consuming by an A/V player the data read.

* * * * *